United States Patent
Uemura

(10) Patent No.: US 7,101,780 B2
(45) Date of Patent: Sep. 5, 2006

(54) METHOD FOR MANUFACTURING GROUP-III NITRIDE COMPOUND SEMICONDUCTOR DEVICE

(75) Inventor: Toshiya Uemura, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 144 days.

(21) Appl. No.: 10/479,485

(22) PCT Filed: Jun. 3, 2002

(86) PCT No.: PCT/JP02/05431

§ 371 (c)(1),
(2), (4) Date: Dec. 3, 2003

(87) PCT Pub. No.: WO02/099901

PCT Pub. Date: Dec. 12, 2002

(65) Prior Publication Data

US 2004/0175912 A1    Sep. 9, 2004

(30) Foreign Application Priority Data

Jun. 4, 2001    (JP) .............................. 2001-167835

(51) Int. Cl.
  *H01L 21/28* (2006.01)
  *H01L 21/44* (2006.01)
(52) U.S. Cl. .............................. 438/605; 257/E21.158; 438/660
(58) Field of Classification Search ................ 438/597, 438/602, 604, 605, 652, 656, 660, 661; 257/E21.173
See application file for complete search history.

(56) References Cited

U.S. PATENT DOCUMENTS

| 6,008,539 | A | 12/1999 | Shibata et al. |
| 6,121,127 | A | 9/2000 | Shibata et al. |
| 6,268,618 | B1 * | 7/2001 | Miki et al. ..................... 257/99 |
| 6,287,947 | B1 * | 9/2001 | Ludowise et al. .......... 438/606 |
| 6,291,840 | B1 | 9/2001 | Uemura et al. |
| 6,319,808 | B1 * | 11/2001 | Ho et al. ..................... 438/597 |
| 6,500,689 | B1 | 12/2002 | Uemura et al. |
| 6,894,391 | B1 * | 5/2005 | Takatani ..................... 257/744 |
| 2004/0233956 | A1 * | 11/2004 | Sano ........................... 372/45 |

FOREIGN PATENT DOCUMENTS

| EP | 0 845 818 A2 | 6/1998 |
| JP | 10-209493 | 8/1998 |
| JP | 2000-12899 | 1/2000 |
| JP | 2001-15811 | 1/2001 |
| JP | 2002-368270 | 12/2002 |

* cited by examiner

OTHER PUBLICATIONS

Tomoyuki Maeda, et al., "Effects of annealing in an oxygen ambient on electrical properties of Ohmic contacts to p-GaN", *The Institute of Electronics, Information and Communication Engineers*, Jul. 22, 1998, vol. 98, No. 185, pp. 89-94.

*Primary Examiner*—Carl Whitehead, Jr.
*Assistant Examiner*—Jennifer M. Dolan
(74) *Attorney, Agent, or Firm*—McGinn IP Law Group, PLLC

(57) ABSTRACT

After a p-seat electrode-forming layer is laminated onto a light-transmissive electrode-forming layer, a first heating step and a second heating step are carried out for alloying the two layers. In the first heating step, heat treatment is performed at a relatively low temperature in an atmosphere containing oxygen. In the second heating step, heat treatment is performed at a relatively high temperature in an atmosphere not containing oxygen.

11 Claims, 1 Drawing Sheet

METHOD FOR MANUFACTURING GROUP-III NITRIDE COMPOUND SEMICONDUCTOR DEVICE

TECHNICAL FIELD

Figure 1:
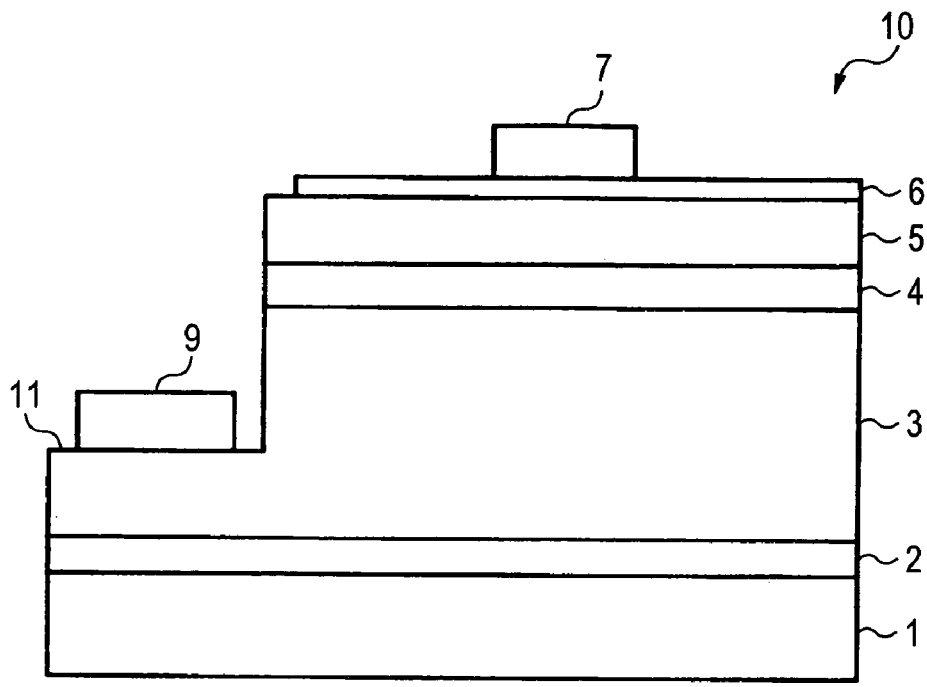

The present invention relates to a Group III nitride compound semiconductor device. For example, the invention is suitable for improvement in electrodes of a Group III nitride compound semiconductor light-emitting device such as a blue light-emitting diode, etc.

BACKGROUND ART

In a Group III nitride compound semiconductor light-emitting device such as a blue light-emitting diode etc., various proposals have been made to obtain uniform light emission from the whole surface of the device.

For example, a light-transmissive electrode is stuck to a p-type layer so that an electric current can be injected into a wide range of a surface of the p-type layer. On this occasion, the light-transmissive electrode is formed as follows. A second electrode layer (e.g., Au) is laminated on a first electrode layer (e.g., Co) to form a light-transmissive electrode-forming layer. The light-transmissive electrode-forming layer is heat-treated in an oxygen-containing gas at a temperature of 500° C. to 600° C. As a result, the light-transmissive electrode-forming layer and the p-type layer are alloyed so that ohmic contact is ensured between the two layers. Incidentally, the distribution of constituent elements of the first electrode layer changes on this occasion.

According to the present inventors' examination, when heat treatment is performed in an oxygen-containing atmosphere at a high temperature of not lower than 500° C., a surface state of a p-seat electrode changes so that reliability of adhesive force to an electrically conductive wire is lowered.

Like the light-transmissive electrode, the p-seat electrode is formed by lamination of a plurality of electrode layers (e.g., successive lamination of Cr and Au viewed from the lower side). When heat treatment is carried out in an oxygen-containing atmosphere at a high temperature, the case where part of the lower metal layer moves to a surface and is segregated there may occur. In this case, there is the possibility that error may occur in image processing (for recognizing the p-seat electrode) at the time of wire-bonding in addition to lowering of adhesive force to the electrically conductive wire.

DISCLOSURE OF THE INVENTION

The invention is developed to solve the aforementioned problem and configured as follows.

A method for producing a Group III nitride compound semiconductor device, includes:

an electrode forming step of forming a first electrode layer by laminating a first metal on a p-type layer of a Group III nitride compound semiconductor and forming a second electrode layer by laminating a second metal having higher ionization potential than the first metal on the first electrode layer;

a first heating step of performing heat treatment at a first temperature in an atmosphere substantially containing oxygen; and a second heating step of performing heat treatment at a second temperature higher than the first temperature in an atmosphere substantially not containing oxygen.

In the producing method according to the invention, sufficient ohmic contact can be ensured between the electrode formed by lamination of the first electrode layer and the second electrode layer and the p-type layer. Also when, for example, a p-seat electrode is formed on the electrode, the condition for heat treatment in an oxygen-containing atmosphere is low temperature (gentle condition), so that a surface of the p-seat electrode can be prevented from being oxidized and a undercoat metal layer for the p-seat electrode can be prevented from being migrated and segregated on the surface of the p-seat electrode.

BRIEF DESCRIPTION OF THE INVENTION

Figure 2:
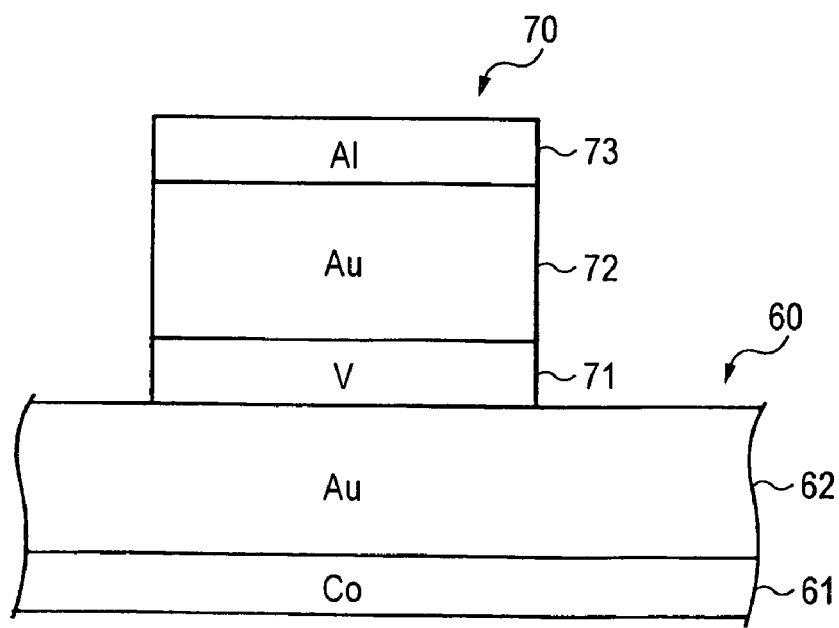

FIG. 1 illustrates a layer structure of a light-emitting device according to an embodiment of the invention; and FIG. 2 illustrates a layer structure of an electrode in the light-emitting device according to the embodiment.

BEST MODE FOR CARRYING OUT THE INVENTION

Description of Group III Nitride Compound Semiconductor

In this specification, each Group III nitride compound semiconductor is represented by the general formula: $Al_XGa_YIn_{1-X-Y}N$ ($0 \leq X \leq 1$, $0 \leq Y \leq 1$, $0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$ in the above). The Group III elements may be partially replaced by boron (B), thallium (Tl), or the like. The nitrogen (N) may be partially replaced by phosphorus (P), arsenic (As), antimony (Sb), bismuth (Bi), or the like. The Group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, after doped with p-type impurities, the group III nitride compound semiconductor may be subjected to electron beam irradiation or plasma irradiation or to heating in a furnace but not essentially. Amethod for forming the Group III nitride compound semiconductor layer is not particularly limited. The Group III nitride compound semiconductor layer may be formed by a metal organic chemical vapor deposition method (MOCVD method) or by a known method such as a molecular beam epitaxy method (MBE method), a halide vapor-phase epitaxy method (HVPE method), a sputtering method, anion-plating method, an electron showering method, etc.

Here, examples of the Group III nitride compound semiconductor device include: optical devices such as a light-emitting diode, a photo acceptance diode, a laser diode, a solar cell, etc.; bipolar devices such as a rectifier, a thyristor, a transistor, etc.; unipolar devices such as an FET, etc.; and electronic devices such as a microwave device, etc. The invention may be also applied to laminates which are intermediates of these devices.

Incidentally, a homo structure, a hetero structure or a double hetero structure may be used as the structure of the light-emitting device. A quantum well structure (single quantum well structure or multiple quantum well structure) may be also used.

Description of Electrode Layers

Electrode layers formed on a p-type layer are not particularly limited if ionization potential of the constituent element of the second electrode layer is higher than that of the constituent element of the first electrode layer. To give light-transmissivity to the electrode layers, metal elements described below are preferably used.

It is preferable that the constituent element of the first electrode layer is an element lower in ionization potential than the constituent element of the second electrode layer, and that the constituent element of the second electrode layer is an element better in ohmic contact with semiconductor than the constituent element of the first electrode layer. The element distribution in the direction of depth from a surface of semiconductor is changed by first heat treatment in an oxygen-containing atmosphere so that the constituent element of the second electrode layer permeates more deeply than the constituent element of the first electrode layer. That is, the element distribution of the electrode layers is reversed to the distribution at the time of formation of the electrode layers. After the formation of the electrode layers, the constituent element of the second electrode layer formed on the upper side is turned on the lower side while the constituent element of the first n-electrode layer formed on the lower side is turned on the upper side.

Preferably, the constituent element of the first electrode layer is at least one element selected from the group consisting of nickel (Ni), cobalt (Co), iron (Fe), copper (Cu), chromium (Cr), tantalum (Ta), vanadium (V), manganese (Mg), aluminum (Al), and silver (Ag). The film thickness of the first electrode layer is selected to be in a range of from 0.5 nm to 15 nm. The constituent element of the second electrode layer is at least one element selected from the group consisting of palladium (Pd), gold (Au), iridium (Ir), and platinum (Pt). The film thickness of the second electrode layer is selected to be in a range of from 3.5 nm to 25 nm. Most preferably, the constituent element of the first electrode layer is Co, and the constituent element of the second electrode layer is Au. In this case, the element distribution in the direction of depth from the semiconductor surface is changed by the heat treatment so that Au permeates more deeply than Co.

Description of p-Seat Electrode

The material for forming a p-seat electrode is not particularly limited either. For example, the p-seat electrode is formed as a structure in which a Cr layer as a first metal layer, an Au layer as a second metal layer and an Al layer as a third metal layer are laminated successively, viewed from the lower side.

The first metal layer is made of an element lower in ionization potential than that of the second metal layer so that the first metal layer can be bonded firmly to a layer under the first metal layer. The second metal layer is made of an element good in bonding characteristic to Al or Au and non-reactive to the light-transmissive electrode. The third metal layer is preferably made of an element which can be bonded firmly to a protective film.

Preferably, the constituent element of the first metal layer is at least one element selected from the group consisting of nickel (Ni), iron (Fe), copper (Cu), chromium (Cr), tantalum (Ta), vanadium (V), manganese (Mg), and cobalt (Co). The film thickness of the first metal layer is in a range of from 1 nm to 300 nm.

Preferably, the constituent element of the third metal layer is at least one element selected from the group consisting of aluminum (Al), nickel (Ni), and titanium (Ti). The film thickness of the third metal layer is in a range of from 1 nm to 30 nm.

Preferably, the constituent element of the second metal layer is gold (Au). The film thickness of the second metal layer is in a range of from 0.3 µm to 3 µm.

A p-auxiliary electrode may be formed by using the same material and the same method as those of the p-seat electrode. In this case, the p-auxiliary electrode has the same thickness as that of the p-seat electrode.

The p-auxiliary electrode may be formed independent of the p-seat electrode. In this case, the material and thickness of the p-auxiliary electrode may be selected to be different from those of the p-seat electrode.

The shape of the p-seat electrode is not particularly limited if the p-seat electrode has an area sufficient to bond an electrically conductive wire by a known method. For the sake of position confirmation at the time of bonding, a shape different from the shape of an n-seat electrode is preferably used as the shape of the p-seat electrode.

The p-auxiliary electrode is preferably formed so as to be narrow because the p-auxiliary electrode blocks off light. The width of the p-auxiliary electrode is selected to be preferably in a range of from 1 µm to 40 µm, more preferably in a range of from 2 µm to 30 µm, more and more preferably in a range of from 3 µm to 25 µm, more and more and more preferably in a range of from 3 µm to 20 µm, most preferably in a range of from 5 µm to 15 µm.

Preferably, irregularities may be provided in the circumference of the p-seat electrode and/or the p-auxiliary electrode so that the area of contact with the light-transmissive electrode can be increased.

Preferably, the circumferential surface of the p-seat electrode is inclined. The circumferential surface of the seat electrode may be tapered so that a protective film (an $SiO_2$ film, etc.) formed on surfaces of the seat electrode and the light-transmissive electrode can be formed on the tapered portion to have a film thickness substantially as designed.

Description of the First Heating Step

The first heating step is carried out in an atmosphere substantially containing oxygen. The following gas may be preferably used for achieving the oxygen-containing atmosphere. That is, at least one member selected from the group consisting of $O_2$, $O_3$, CO, $CO_2$, NO, $N_2O$, $NO_2$ and $H_2O$ or a mixture gas thereof may be used as an oxygen-containing gas. Or a mixture gas containing an insert gas and at least one member selected from the group consisting of $O_2$, $O_3$, CO, $CO_2$, NO, $N_2O$, $NO_2$ and $H_2O$ or a mixture gas containing an inert gas and a mixture gas of members selected from the group consisting of $O_2$, $O_3$, CO, $CO_2$, NO, $N_2O$, $NO_2$ and $H_2O$ may be used as the oxygen-containing gas. In short, the oxygen-containing gas means a gas of oxygen atoms or molecules having oxygen atoms. Especially, an oxidizing gas atmosphere is preferred.

The pressure of the atmosphere at the time of heating maybe preferably not lower than a pressure under which a gallium nitride compound semiconductor is not thermally decomposed at the heat-treatment temperature. When only $O_2$ gas is used as the oxygen-containing gas, the gas maybe preferably introduced so that the pressure of the gas is not lower than the decomposition pressure of the gallium nitride compound semiconductor. When an inert gas mixed with the $O_2$ gas is used, the oxygen-containing gas can work sufficiently if the pressure of the whole gas is not lower than the decomposition pressure of the gallium nitride compound semiconductor and the rate of the $O_2$ gas to the whole gas is not lower than about $10^{-6}$. In short, the oxygen-containing gas can work sufficiently if a very small amount of the oxygen-containing gas is present. Incidentally, the upper limit of the amount of the oxygen-containing gas introduced is not particularly limited from the point of view of electrode alloying characteristic. That is, any amount of the oxygen-containing gas may be used if production can be made.

The heat-treatment temperature is preferably selected to be lower than 440° C. If the heat-treatment temperature is not lower than 440° C., there is the possibility that the aforementioned problem may occur. The heat-treatment temperature is more preferably lower than 420° C., more and more preferably lower than 400° C.

The heating time is not particularly limited if migration can occur between the first electrode layer and the second electrode layer. The heating time is selected to be preferably in a range of from 5 minutes to 1000 minutes, more preferably in a range of from 10 minutes to 500 minutes, more and more preferably in a range of from 30 minutes to 300 minutes.

Description of the Second Heating Step

The second heating step is carried out in an atmosphere substantially containing no oxygen. That is, heat treatment is preferably carried out in a non-oxidizing atmosphere or in a reducing atmosphere without use of the oxygen-containing gas used in the first heating step. Specifically, heat treatment is preferably carried out in an inert gas such as $N_2$, He, Ar, etc., in a reducing gas such as $H_2$, etc. or in a mixture gas of these gases.

The heat-treatment temperature is selected to be higher than the heat-treatment temperature used in the first heating step. As a result, ohmic contact can be obtained between the electrode layer and the p-type layer. If the heat treatment at a high temperature is omitted, ohmic contact cannot be obtained between the two layers (see Comparative Example 3 in Table 1). Therefore, the required heat-treatment condition in the second heating step is heating temperature and heating time sufficient to ensure ohmic contact between the electrode layer and the p-type layer.

The heat-treatment temperature is selected to be preferably not lower than 440° C., more preferably not lower than 480° C., more and more preferably not lower than 520° C.

The heating time is selected to be preferably in a range of from 0.1 minutes to 180 minutes, more preferably in a range of from 0.3 minutes to 60 minutes, more and more preferably in a range of from 0.5 minutes to 30 minutes.

The pressure of the atmosphere in the second heating step may be preferably not lower than a pressure under which a Group III nitride compound semiconductor is not thermally decomposed at the heat-treatment temperature.

The sequence of execution of the first heating step and the second heating step is not particularly limited.

After the heat-treatment temperature increased slowly in an atmosphere supplying the oxygen-containing gas (by execution of the first heating step) reaches 440° C., the supply of the oxygen-containing gas may be stopped so that the second heating step can be carried out after that.

EXAMPLES

Examples of the invention will be described below.
First, semiconductor layers are laminated according to each configuration shown in Table 1.

| Layer | Composition |
|---|---|
| p-type layer 5 | p-GaN:Mg |
| Layer 4 containing a light-emitting layer 4 | InGaN layer-containing layer |
| n-type layer 3 | n-GaN:Si |
| Buffer layer 2 | AlN |
| Substrate 1 | sapphire |

An n-type layer 3 of GaN doped with Si as n-type impurities is formed on a substrate 1 through a buffer layer 2. Although the case where sapphire is used as the substrate 1 is shown here, the substrate 1 is not limited thereto. Sapphire, spinel, silicon, silicon carbide, zinc oxide, gallium phosphide, gallium arsenide, magnesium oxide, manganese oxide, Group III nitride compound semiconductor single crystal, etc. maybe used as the substrate 1. Although the buffer layer is formed of AlN by an MOCVD method, the buffer layer is not limited thereto. GaN, InN, AlGaN, InGaN, AlInGaN, etc. may be used as the material of the buffer layer. A molecular beam epitaxy method (MBE method), a halide vapor-phase epitaxy method (HVPE method), a sputtering method, an ion-plating method, an electron showering method, etc. may be used as the method for producing the buffer layer. When GaN is used as the substrate, the buffer layer can be dispensed with.

After the semiconductor device is formed, both the substrate and the buffer layer may be removed in accordance with necessity.

Although the case where the n-type layer is made of GaN is shown here, AlGaN, InGaN or AlInGaN may be used.

Although the n-type layer is doped with Si as n-type impurities, Ge, Se, Te, C, etc. may be used as other n-type impurities.

The n-type layer 3 may be of a double-layered structure having an n− layer of low electron density on the side of the layer 4 containing a light-emitting layer and an n+ layer of high electron density on the buffer layer 2 side.

The layer 4 containing a light-emitting layer may contain a light-emitting layer of a quantum well structure. A single hetero type, a double hetero type or a homo-junction type structure may be used as the structure of the light-emitting device.

The layer 4 containing a light-emitting layer may contain a Group III nitride compound semiconductor layer disposed on the p-type layer 5 side, doped with an acceptor such as magnesium etc. and having a wide band gap. This is provided for effectively preventing electrons injected into the layer 4 containing a light-emitting layer from diffusing into the p-type layer 5.

A p-type layer 5 of GaN doped with Mg as p-type impurities is formed on the layer 4 containing a light-emitting layer. Alternatively, the p-type layer may be made of AlGaN, InGaN or InAlGaN. Zn, Be, Ca, Sr or Ba may be used as p-type impurities.

The p-type layer 5 may be of a double-layered structure having a p− layer of low hole density on the side of the layer 4 containing a light-emitting layer and a p+ layer of high hole density on the electrode side.

In the light-emitting diode configured as described above, each Group III nitride compound semiconductor layer may be formed by execution of MOCVD in a general condition or may be formed by amethod such as a molecular beam epitaxy method (MBE method), a halide vapor-phase epitaxy method (HVPE method), a sputtering method, an ion-plating method, an electron showering method, etc.

Then, a mask is formed and the p-type layer 5, the layer 4 containing a light-emitting layer and the n-type layer 3 are partially removed by reactive ion etching to reveal an n-electrode-forming surface 11 on which an n-electrode 9 is to be formed.

Next, a method for forming a light-transmissive electrode-forming layer 60 and a p-seat electrode-forming layer 70 will be described with reference to FIG. 2.

First, a Co layer (1.5 nm) 61 as a first electrode layer and an Au layer (60 nm) 62 as a second electrode layer are laminated successively on the whole surface of a wafer by an evaporation apparatus. Then, a photo resist is applied evenly and removed from the n-electrode-forming surface 11 and an approximately 10 μm-wide portion (clearance region) outside the circumference of the n-electrode-forming surface 11 by photolithography. Light-transmissive electrode-forming materials 61 and 62 are removed from the portion by etching to thereby reveal the p-type layer 5. Then, the photo resist is removed.

Then, a p-seat electrode-forming layer 70 is formed by a lift-off method in such a manner that a Cr layer (30 nm) 71, an Au layer (1.5 μm) 72 and an Al layer (10 nm) 73 are laminated successively by vapor deposition.

Incidentally, an n-electrode-forming layer is also formed by a lift-off method in such a manner that vanadium and aluminum are laminated successively.

Each sample obtained in the aforementioned manner is heat-treated under the following condition.

TABLE 1

| | Heating step 1 | | | |
|---|---|---|---|---|
| | Temperature (° C.) | Time (min) | Additive gas | Carrier gas |
| Example 1 | *380* | *60* | *$O_2$ (1%)* | *$N_2$* |
| Example 2 | *380* | *60* | *$O_2$ (1%)* | *$N_2$* |
| Example 3 | 500 | 10 | | $N_2$ |
| Example 4 | 500 | 10 | $H_2$ (1%) | $N_2$ |
| Example 5 | 500 | 10 | $H_2$ (3%) | $N_2$ |
| Example 6 | *380* | *60* | *$O_2$ (1%)* | *$N_2$* |
| Example 7 | 550 | 3 | | $N_2$ |
| Example 8 | 550 | 3 | $H_2$ (1%) | $N_2$ |
| Comparative Example 1 | 550 | 3 | $O_2$ (1%) | $N_2$ |
| Comparative Example 2 | 550 | 3 | | $N_2$ |
| Comparative Example 3 | *380* | *60* | *$O_2$ (1%)* | *$N_2$* |

| | Heating step 2 | | | |
|---|---|---|---|---|
| | Temperature (° C.) | Time (min) | Additive gas | Carrier gas |
| Example 1 | 500 | 10 | | $N_2$ |
| Example 2 | 500 | 10 | $H_2$ (1%) | $N_2$ |
| Example 3 | *380* | *60* | *$O_2$ (1%)* | *$N_2$* |
| Example 4 | *380* | *60* | *$O_2$ (1%)* | *$N_2$* |
| Example 5 | *380* | *60* | *$O_2$ (1%)* | *$N_2$* |

TABLE 1-continued

| Example 6 | 440 | 120 | | $N_2$ |
|---|---|---|---|---|
| Example 7 | *380* | *60* | *$O_2$ (1%)* | *$N_2$* |
| Example 8 | *380* | *60* | *$O_2$ (1%)* | *$N_2$* |
| Comparative Example 1 | | | | |
| Comparative Example 2 | | | | |
| Comparative Example 3 | 380 | 120 | | $N_2$ |

| | Heating step 3 | | | |
|---|---|---|---|---|
| | Temperature (° C.) | Time (min) | Additive gas | Carrier gas |
| Example 1 | | | | |
| Example 2 | *380* | *60* | *$O_2$ (1%)* | *$N_2$* |
| Example 3 | | | | |
| Example 4 | | | | |
| Example 5 | | | | |
| Example 6 | | | | |
| Example 7 | | | | |
| Example 8 | | | | |
| Comparative Example 1 | | | | |
| Comparative Example 2 | | | | |
| Comparative Example 3 | | | | |

| | Contact resistance | Optical output | W/B property | External appearance |
|---|---|---|---|---|
| Example 1 | Low | 100 | ○ | ○ |
| Example 2 | Low | 100 | ○ | ○ |
| Example 3 | Low | 100 | ○ | ○ |
| Example 4 | Low | 100 | ○ | ○ |
| Example 5 | Low | 100 | ○ | ○ |
| Example 6 | Low | 100 | ○ | ○ |
| Example 7 | Low | 100 | ○ | ○ |
| Example 8 | Low | 100 | ○ | ○ |
| Comparative Example 1 | Low | 100 | Δ | Δ |
| Comparative Example 2 | High | 100 | ○ | ○ |
| Comparative Example 3 | High | 100 | ○ | ○ |

In Table 1, the first heating step (heat treatment in an oxygen-containing atmosphere at a relatively low temperature) is expressed in italics.

In Table 1, high/low contact resistance is judged based on the voltage of the device when a current of 20 mA flows in the device.

There is little difference in optical output between Example and Comparative Example W/B property (wire-bonding property) is evaluated on the basis of ball shear strength.

External appearance is examined in such a manner that the surface of the p-seat electrode is observed through a microscope. The case where the surface is uniform and homogeneous is evaluated as ○. The case where segregation of Cr is observed is evaluated as Δ.

It is obvious from Table 1 that both wire-bonding property and external appearance are improved while contact resistance is kept as low as that in Comparative Example 1 (conventional method) when the first heating step for performing heat treatment at a relatively low temperature in an atmosphere substantially containing oxygen and the second heating step for performing heat treatment at a relatively high temperature in an atmosphere substantially containing no oxygen (preferably in a reducing atmosphere) are carried out regardless of the sequence of execution of the steps.

It is also obvious that contact resistance becomes high when the first heating step is omitted (see Comparative Example 2).

It is further obvious that contact resistance also becomes high when the second heating step (heat treatment at a high temperature) is omitted though the first heating step is carried out (see Comparative Example 3).

Although the invention has been described in detail and with reference to specific embodiments, it is obvious to those skilled in the art that various changes or modifications may be made without departing from the spirit and scope of the invention.

This application is based on a Japanese Patent application (Japanese Patent Application No. 2001-167835) filed on Jun. 4, 2001, which is incorporated herein by reference.

INDUSTRIAL APPLICABILITY

As described above, when the two heating steps proposed by the invention are carried out, adhesive force between the p-seat electrode and the electrically conductive wire can be prevented from being lowered by oxidization of the surface of the p-seat electrode while ohmic contact between the p-type layer of a Group III nitride compound semiconductor and the light-transmissive electrode can be kept good.

The invention is not limited to the description of Mode for Carrying Out the Invention and Examples at all. Various modifications that can be easily conceived by those skilled in the art may be contained in the invention without departing from the scope of claim.

The following items are disclosed.

11. A method of heating a p-type layer of a Group III nitride compound semiconductor and a light-transmissive electrode-forming layer having a first electrode layer formed on the p-type layer and containing a first metal, and a second electrode layer formed on the first electrode layer and containing a second metal higher in ionization potential than the first metal, including:
    a first heating step of performing heat treatment at a first temperature in an atmosphere substantially containing oxygen; and
    a second heating step of performing heat treatment at a second temperature higher than the first temperature in an atmosphere substantially containing no oxygen.
12. A heating method according to the paragraph 11, wherein the second heating step is carried out after the first heating step.
13. A heating method according to the paragraph 11, wherein the first heating step is carried out after the second heating step.
14. A heating method according to any one of the paragraphs 11 through 13, wherein the first temperature is lower than 440° C.
15. A heating method according to any one of the paragraphs 11 through 14, wherein the second heating step is carried out in a non-oxidizing atmosphere or in a reducing atmosphere.
16. A heating method according to any one of the paragraphs 11 through 15, wherein the electrode-forming step further includes a step of forming a p-seat electrode.
17. A heating method according to any one of the paragraphs 11 through 16, wherein the first metal is cobalt (Co) whereas the second metal is gold (Au).
21. A Group III nitride compound semiconductor light-emitting device obtained by heating a light-transmissive electrode-forming layer in two heating steps, wherein:
    the light-transmissive electrode-forming layer is formed in such a manner that a first electrode layer containing a first metal is laminated on a p-type layer of a Group III nitride compound semiconductor and then a second electrode layer containing a second metal higher in ionization potential than the first metal is laminated on the first electrode layer; and
    the two heating steps are a first heating step for performing heat treatment at a first temperature in an atmosphere substantially containing oxygen, and a second heating step for performing heat treatment at a second temperature higher than the first temperature in an atmosphere substantially containing no oxygen.
22. A Group III nitride compound semiconductor device according to the paragraph 21, wherein the second heating step is carried out after the first heating step.
23. A Group III nitride compound semiconductor device according to the paragraph 21, wherein the first heating step is carried out after the second heating step.
24. A Group III nitride compound semiconductor device according to any one of the paragraphs 21 through 23, wherein the first temperature is lower than 440° C.
25. A Group III nitride compound semiconductor device according to any one of the paragraphs 21 through 24, wherein the second heating step is carried out in a non-oxidizing atmosphere or in a reducing atmosphere.
26. A Group III nitride compound semiconductor device according to any one of the paragraphs 21 through 25, wherein the electrode-forming step further includes a step of forming a p-seat electrode.
27. A Group III nitride compound semiconductor device according to any one of the paragraphs 21 through 26, wherein the first metal is cobalt (Co) whereas the second metal is gold (Au).

The invention claimed is:

1. A method for producing a Group III nitride compound semiconductor device, comprising:
    an electrode forming step of forming a first electrode layer by laminating a first metal on a p-type layer of a Group III nitride compound semiconductor and forming a second electrode layer by laminating a second metal having higher ionization potential than said first metal on said first electrode layer;
    a first heating step of performing heat treatment of said first and second electrode layers at a first temperature in an atmosphere substantially containing oxygen; and
    a second heating step of performing heat treatment of said first and second electrode layers at a second temperature higher than said first temperature in an atmosphere substantially not containing oxygen.

2. A method for producing a Group III nitride compound semiconductor device according to claim 1, wherein said second heating step is carried out after said first heating step.

3. A method for producing a Group III nitride compound semiconductor device according to claim 1, wherein said first heating step is carried out after said second heating step.

4. A method for producing a Group III nitride compound semiconductor device according to claim 1, wherein said first temperature is lower than 440°C.

5. A method for producing a Group III nitride compound semiconductor device according to claim 1, wherein said second heating step is carried out in a non-oxidizing atmosphere or in a reducing atmosphere.

6. A method for producing a Group III nitride compound semiconductor device according to claim 1, wherein said second temperature is not lower than 440°C.

7. A method for producing a Group III nitride compound semiconductor device according to claim 1, wherein said electrode forming step further includes the step of forming a p-seat electrode.

8. A method for producing a Group III nitride compound semiconductor device according to claim 1, wherein said first metal is cobalt whereas said second metal is gold.

9. A method for producing a Group III nitride compound semiconductor device according to claim 1, wherein said first temperature is lower than 420°C.

10. A method for producing a Group III nitride compound semiconductor device according to claim 1, wherein said first temperature is lower than 400°C.

11. A method for producing a Group III nitride compound semiconductor device, comprising:

forming a first electrode layer by laminating a first metal on a p-type layer of a Group III nitride compound semiconductor;

forming a second electrode layer by laminating a second metal having higher ionization potential than said first metal on said first electrode layer;

performing a first heat treatment of said first and second electrode layers at a first temperature in an atmosphere substantially including oxygen; and performing a second heat treatment of said first and second electrode layers at a second temperature which is higher than said first temperature in an atmosphere substantially not including oxygen.

* * * * *